(12) United States Patent
Pigott

(10) Patent No.: US 6,803,832 B2
(45) Date of Patent: Oct. 12, 2004

(54) OSCILLATOR CIRCUIT HAVING REDUCED LAYOUT AREA AND LOWER POWER SUPPLY TRANSIENTS

(75) Inventor: John M. Pigott, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/236,230

(22) Filed: Sep. 6, 2002

(65) Prior Publication Data

US 2004/0046614 A1 Mar. 11, 2004

(51) Int. Cl.$^7$ .................................................. H03B 5/24
(52) U.S. Cl. ........................ 331/143; 331/111; 331/74
(58) Field of Search .......................... 331/74, 111, 143, 331/57; 327/175

(56) References Cited

U.S. PATENT DOCUMENTS

| | | |
|---|---|---|
| 4,904,960 A | 2/1990 | Izadinia |
| 5,128,634 A | 7/1992 | Pigott |
| 5,459,437 A * | 10/1995 | Campbell .................... 331/111 |
| 6,373,343 B1 * | 4/2002 | Baldwin et al. .............. 331/76 |

FOREIGN PATENT DOCUMENTS

GB          2015289 A          9/1979

OTHER PUBLICATIONS

PCT/US03/27432 International Search Report.

* cited by examiner

Primary Examiner—Arnold Kinkead
(74) Attorney, Agent, or Firm—Daniel D. Hill

(57) ABSTRACT

An oscillator circuit (40, 60) has a comparator circuit (48, 68) and a monitor and control circuit (50, 80). The comparator (48, 68) provides a periodic output signal. The monitor and control circuit (50, 80) controls the voltage swing of the periodic output voltage in response to monitoring a periodic input voltage. A capacitor (52, 90) is coupled between the output terminal of the monitor and control circuit (50, 80) and input terminal of the comparator (48, 68) and is sized to set the oscillation frequency. The monitor and control circuit (50, 80) functions to limit the input voltage excursions without using an attenuation capacitor (16). Eliminating the attenuation capacitor (16) provides a smaller oscillator circuit having reduced power supply current spikes and which is easier to implement.

17 Claims, 4 Drawing Sheets

FIG. 1 —PRIOR ART—

OSCILLATOR CIRCUIT HAVING REDUCED LAYOUT AREA AND LOWER POWER SUPPLY TRANSIENTS

FIELD OF THE INVENTION

The present invention generally relates to oscillator circuits, and more specifically relates to an oscillator circuit having reduced layout area and lower power supply transients.

RELATED ART

Oscillator circuits are found in many electronic circuit applications. For example, oscillator circuits can be found in DC/DC converters, capacitive sensors, audio receivers, and FM (frequency modulation) generators, to name a few. Generally, the frequency of the oscillator is set by a capacitor. However, as the capacitor is charged and discharged during operation of some oscillator circuits, the voltage on some internal nodes can be boosted beyond the power supply rails causing abnormal behavior. To prevent excursions outside the power supply rails, attenuation capacitors have been used. However, adding attenuation capacitors increases the total amount of capacitance that is charged and discharged, resulting in large spikes in power supply current. In addition, the attenuation capacitors need to be at least as large as the capacitors used to set the frequency and therefore greatly increase the amount of surface area required to implement the oscillator circuit on an integrated circuit. In some cases, a user of an integrated circuit oscillator needs to be able to set the oscillation frequency of the oscillator. One way to make the oscillation frequency user settable is to use an external oscillation capacitor. However, because the size of the attenuation capacitor is dependent on the size of the oscillation capacitor, the user must add two external capacitors, an oscillation capacitor and an attenuation capacitor, to set the oscillation frequency. Therefore, there is a need for an integrated circuit oscillator that eliminates the need for attenuation capacitors.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides a CMOS (complementary metal-oxide semiconductor) oscillator circuit having a switchable current source controlled by a feedback signal, a comparator circuit, a monitor and control circuit, and a feedback capacitor. The comparator circuit provides an output signal dependent on the voltage at its input(s). The monitor and control circuit is coupled to both input and output terminals of the comparator circuit for monitoring and controlling a voltage swing of its output voltage. The feedback capacitor is coupled between the output terminal of the monitor and control circuit and input terminal of the comparator and is sized to set the oscillation frequency as desired. Because the accuracy of the comparator is not critical, a simple high-gain inverter circuit can be used for this function.

The monitor and control circuit constrains its output signal within the power supply rails without the use of an attenuation capacitor. By eliminating the attenuation capacitor from the oscillator circuit, the oscillator circuit can be made smaller, thus requiring less surface area of an integrated circuit. Also, power supply current spikes are reduced because the additional capacitance of an attenuation capacitor is not being repeatedly charged and discharged along with the oscillation capacitor. In addition, if a user needs to be able to set the oscillation frequency, only one external capacitor is connected to the terminals of the device unlike some prior art oscillator circuits that require of at least two external capacitors, an oscillation capacitor and an attenuation capacitor.

Figure 1:
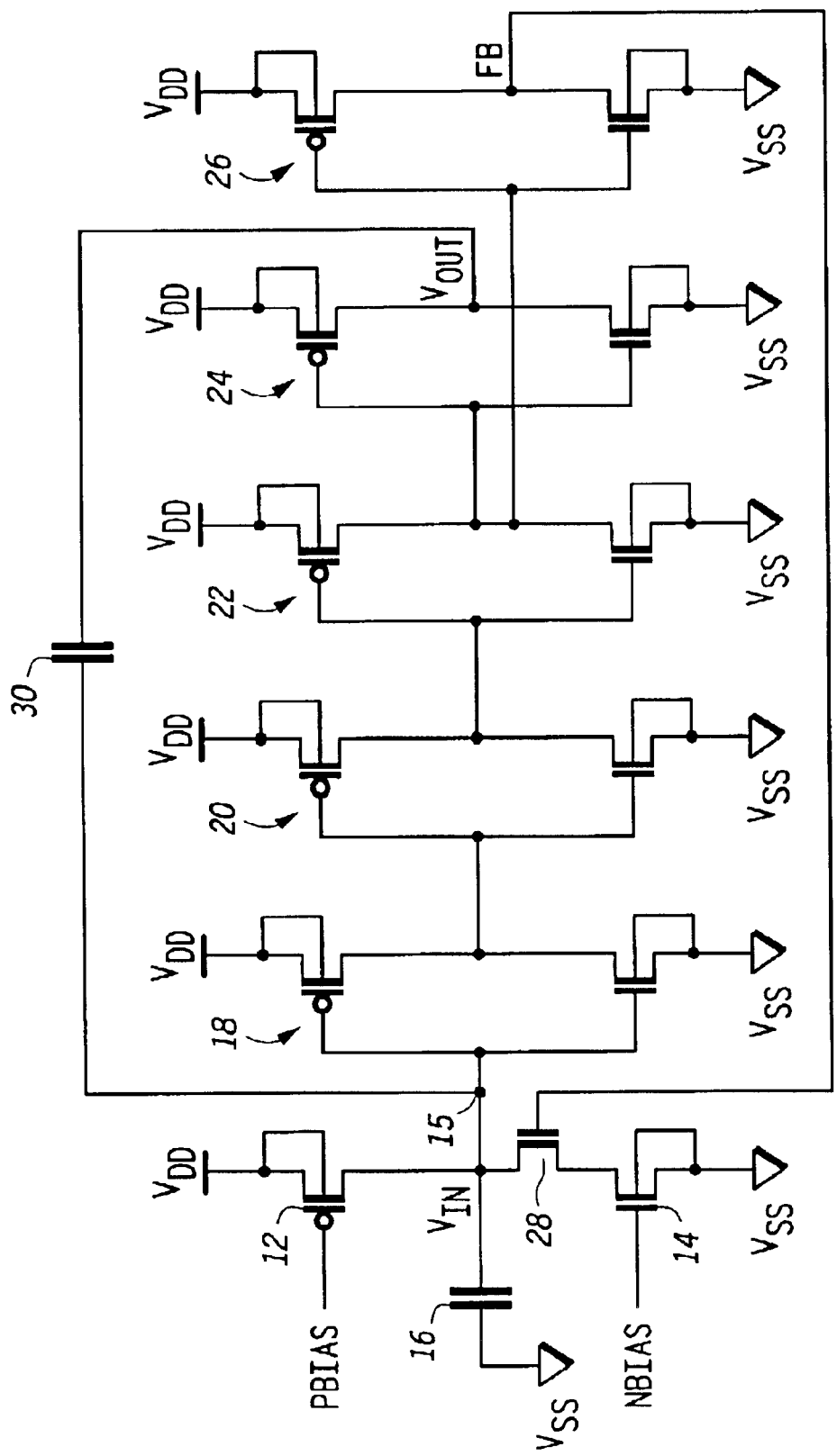
FIG. 1 illustrates, in schematic diagram form, an oscillator circuit in accordance with the prior art.

FIG. 1 illustrates, in schematic diagram form, an oscillator circuit 10 in accordance with the prior art. A feedback capacitor 30 is connected between an input and an output of a plurality of series-connected inverters 18, 20, 22, and 24. The plurality of series-connected inverters functions as a comparator with a reference voltage of about half of the supply voltage. The current that charges and discharges the capacitor is generated using a P-channel transistor 12, and N-channel transistors 14 and 28. P-channel transistor 12 and N-channel transistor 14 are biased to operate as current sources. N-channel transistor 28 functions as a switch in response to a control signal provided by inverter 26. As the voltage at node 15 that is inputted to the plurality of series-connected inverters transitions above and below the threshold of the inverters, an output voltage $V_{OUT}$ of inverter 24 switches high or low. The feedback capacitor 30 coupled between the output terminal of inverter 24 and the input terminal of inverter 18 has the effect of raising the voltage $V_{IN}$ above the power supply voltage. An analysis of oscillator circuit 10 shows that the oscillation frequency of oscillator circuit 10 is a function of the capacitance value of capacitor 30, the amplitude of the voltage swing at the output $V_{OUT}$ and the amount of current provided by current sources 12 and 14. Attenuation capacitor 16, coupled to the input terminal of inverter 18, is used to keep $V_{IN}$ within the power supply rails because of charge sharing between capacitor 16 and capacitor 30. To keep $V_{IN}$ within the power supply rails, capacitor 16 should generally be at least as large as capacitor 30. Attenuation capacitor 16 had no effect on the oscillation frequency because the attenuation of the voltage swing on $V_{IN}$ provided by the capacitor is exactly balanced by the increased effective capacitance charged by the current sources. However, it would be desirable to maintain the voltage swing of $V_{IN}$ within the supply rails without using attenuation capacitor 16.

Figure 2:
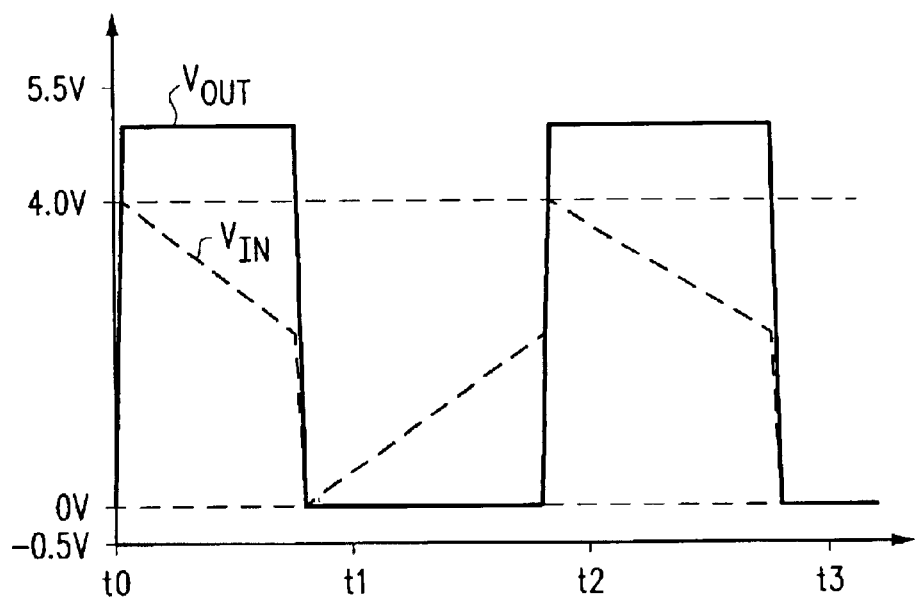
FIG. 2 illustrates a waveform of the input and output voltages of the oscillator circuit of FIG. 1.

FIG. 2 illustrates a waveform of the input and output voltages of oscillator circuit 10 of FIG. 1. Referring now to both FIG. 1 and FIG. 2, at time immediately after t0, $V_{IN}$ is at a high voltage. $V_{OUT}$ is also at a high voltage. Feedback voltage FB is high, causing switch 28 to close, beginning the discharge of capacitors 16 and 30 by current source 14. The rate of discharge of capacitors 16 and 30 is illustrated in FIG. 2 by the slope of $V_{IN}$ between times t0 and t1 and is dependent on the size of capacitors 16 and 30. As the voltage at node 15 decreases to the threshold voltage of inverter 18, the output of inverter 18 becomes a high voltage and $V_{OUT}$ becomes a low voltage. This is the end of the first half-cycle. This voltage is coupled to the input node 15 via capacitor 30. The output of inverter 26 transitions to a low voltage, thus causing switch 28 to open, or become substantially non-conductive. When switch 28 is open, capacitors 16 and 30 are now charged toward the power supply voltage $V_{DD}$ as illustrated between times t1 and t2. When the voltage again reaches the threshold of the inverter, the signals switch, ending the second half-cycle.

The addition of capacitor 16 to oscillator 10 does not affect the frequency of oscillation, but is only used to attenuate the voltage swings at $V_{IN}$.

If capacitor 16 was not incorporated, the voltage swing at $V_{IN}$ in each half cycle would be equal to the swing at $V_{OUT}$, and therefore have excursions outside the supply rails, causing undesirable operation of the circuit.

The duration of each half cycle is equal to the time required to change the voltage on capacitor 30 by the amount of the voltage swing on $V_{OUT}$, i.e. t=C30*$V_{OUT}$_swing/current, where C30 is the capacitance of capacitor 30. Capacitor 16 attenuates the voltage swing to be $V_{OUT}$*C30/(C16+C30), but also increases the effective capacitance that must be charged to (C16+C30) Therefore the time is t=(C16+C30)*$V_{OUT}$*C30/(C16+C30)/current= C30*VOUT_swing/current, as before. However, integrating attenuation capacitor 16 requires a large amount of surface area on an integrated circuit. Also, charging and discharging the capacitance causes power supply current spikes. In addition, some applications of oscillator circuit 10 may allow oscillator capacitor 30 to be connected externally to the circuit to allow a user to choose the oscillation frequency. In this case, the user must add two capacitors, an oscillator capacitor and an attenuation capacitor.

Figure 3:
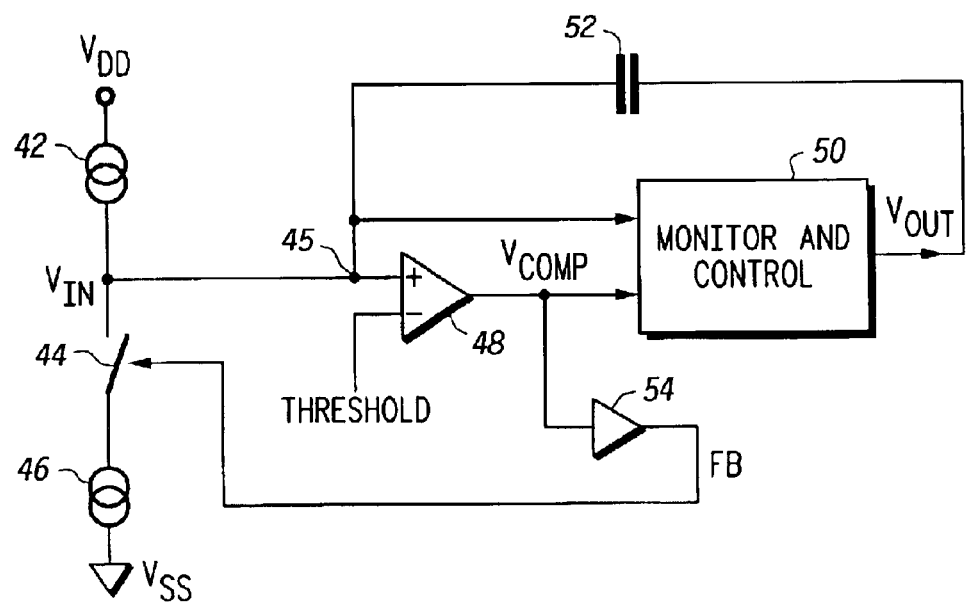
FIG. 3 illustrates in partial block diagram form and partial schematic diagram form, an oscillator circuit in accordance with one embodiment of the present invention.

FIG. 3 illustrates, in partial block diagram form and partial schematic diagram form, oscillator circuit 40 in accordance with one embodiment of the present invention. In one embodiment, oscillator circuit 40 may be implemented on an integrated circuit using CMOS (complementary metal-oxide semiconductor) circuit elements. Oscillator circuit 40 includes current sources 42 and 46, switch 44, comparator 48, monitor and control circuit 50, capacitor 52 and buffer circuit 54.

As illustrated in FIG. 3, current sources 42 and 46 and switch 44 are connected together in series between a power supply voltage terminal labeled $V_{DD}$ and a power supply voltage terminal labeled $V_{SS}$. Power supply voltage terminal $V_{DD}$ receives, for example, a power supply voltage of 5 volts and power supply voltage terminal $V_{SS}$ is at ground potential. In one embodiment, current source 42 is a P-channel transistor and current source is an N-channel transistor biased to function as current sources. A first input terminal of comparator 48 is coupled between current source 42 and switch 44 at a node 45 for receiving an input voltage $V_{IN}$. A second input terminal receives a threshold voltage labeled THRESHOLD and an output terminal provides an output voltage labeled $V_{OUT}$. Note that in the illustrated embodiment, the threshold voltage THRESHOLD is about one-half of the power supply voltage, but in other embodiments, the threshold voltage can be different than one-half the power supply voltage. The threshold voltage does not directly affect the oscillation frequency and its value is not critical, therefore the comparator 48 can be constructed from a simple CMOS inverter where the effective threshold voltage is inherent in the construction of the inverter and is about midway between the supply voltages. Monitor and control circuit 50 has input terminals coupled to monitor both $V_{IN}$ and $V_{OUT}$, and in response, provides an amplitude controlled output voltage. In one embodiment, by way of example, monitor and control circuit 50 may include an N-channel transistor and a P-channel transistor coupled in series between the output of comparator 48 and capacitor 52 with their gates connected to node 45 (not shown). Capacitor 52 is coupled between the output of monitor and control circuit 50 and node 45. Buffer circuit 54 is coupled to the output of comparator 48 for controlling switch 44. Note that the type of circuit used to implement comparator 48 is not important and can be any circuit that provides a positive output for an input voltage above a predetermined threshold and that provides a negative, or lower output, for an input voltage below the same predetermined threshold.

In operation, oscillator circuit 40 generally functions in a similar manner to oscillator circuit 10 except that instead of using an attenuation capacitor to keep $V_{IN}$ below the supply rails, oscillator circuit 40 uses monitor and control circuit 50. Still referring to FIG. 3, periodic input voltage $V_{IN}$ is generated at node 45 by opening and closing switch 44. When switch 44 is open, the current from current source 42 charges capacitor 52 toward $V_{DD}$. When the voltage at node 45 reaches a predetermined voltage level, monitor and control circuit 50 prevents $V_{IN}$ from increasing further by controlling the monitor and control circuit 50 voltage $V_{OUT}$. In other words, monitor and control circuit 50 controls $V_{OUT}$ in order to prevent $V_{IN}$ from approaching to close to the power supply voltage. As $V_{COMP}$ switches a logic high feedback voltage FB causes switch 44 to close. When switch 44 is closed, a current through current source 46 begins the discharge of capacitor 52 toward $V_{SS}$. As input voltage $V_{IN}$ decreases below the threshold voltage THRESHOLD, the comparator output voltage $V_{COMP}$ switches and output voltage $V_{OUT}$ decreases. When $V_{OUT}$ is reduced below a predetermined voltage level, monitor and control circuit 50 prevents $V_{IN}$ from decreasing further by limiting the voltage drop of $V_{OUT}$, until the current sources have partially charged capacitor 52. As $V_{OUT}$ is reduced, feedback voltage FB causes switch 44 to open once again. Current source 42 again charges capacitor 52.

Monitor and control circuit 50 controls the voltage swing of voltage $V_{IN}$ by limiting the amount of charge on capacitor 52 without using an attenuation capacitor as shown above with the prior art circuit of FIG. 1. Because only the oscillation capacitor 52 is used, oscillator circuit 40 can be integrated using less surface area. Also, in an embodiment that uses an external oscillator capacitor, only one capacitor needs to be added to the circuit. Note that the configuration of current sources 42 and 46 and switch 44 illustrated in FIG. 3 is only one way of providing a current at node 45. Those skilled in the art will realize that there are other circuits for providing the current the current at node 65. For example, in another embodiment, an additional switch can be added between current source 42 and node 45 for providing additional control.

Figure 4:
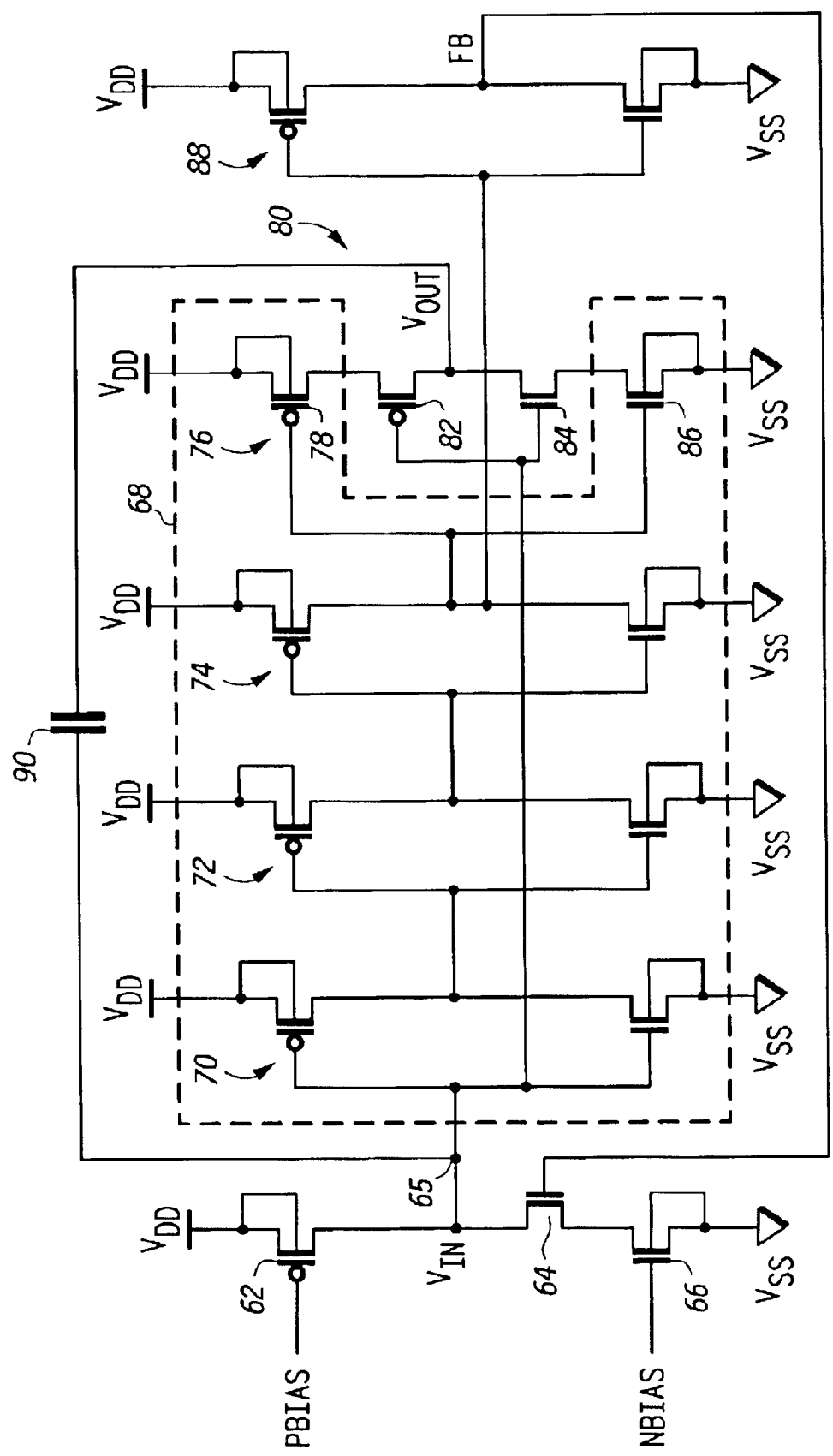
FIG. 4 illustrates, in schematic diagram form, an oscillator circuit in accordance with another embodiment of the present invention.

FIG. 4 illustrates, in schematic diagram form, oscillator circuit 60 in accordance with another embodiment of the present invention. Oscillator circuit 60 includes P-channel transistor 62, N-channel transistors 64 and 66, a plurality of series-connected inverters 68, monitor and control circuit 80, inverter 88, and capacitor 90. The plurality of series-connected inverters 68 includes inverters 70, 72, 74, and 76. Monitor and control circuit 80 includes P-channel transistor 82 and N-channel transistor 84. P-channel transistor 62 has a source connected to power supply voltage terminal $V_{DD}$, a gate for receiving bias voltage $P_{BIAS}$, and a drain. N-channel transistor 64 has a drain connected to the drain of P-channel transistor 62 at node 65, a gate, and a source. N-channel transistor 66 has a drain connected to the source of N-channel transistor 64, a gate for receiving bias voltage $N_{BIAS}$, and a source connected to power supply voltage terminal VSS. P-channel transistor 62 and N-channel transistor 66 both function as switchable current sources that alternately charge and discharge feedback capacitor 90 under the control of feedback signal FB. N-channel transistor 64 functions as a switch.

First inverter 70 of the plurality of series-connected inverters 68 has an input terminal connected to node 65, and an output terminal. Inverter 72 has an input terminal connected to the output terminal of inverter 70, and an output terminal. Inverter 74 has an input terminal connected to the output terminal of inverter 72, and an output terminal. The last inverter 76 includes P-channel transistor 78 and N-channel transistor 86. The gates of transistors 78 and 86 are connected to the output terminal of inverter 74. A source of transistor 78 is connected to $V_{DD}$ and a drain of transistor 86 is connected to $V_{SS}$. Note that in FIG. 4, inverter 76 is coupled to $V_{DD}$ and $V_{SS}$. However, in other embodiments, inverter 76 may be coupled to regulated supply voltage to give more precise control of the oscillation frequency. Monitor and control circuit 80 is connected between transistors 78 and 86. P-channel transistor 82 has a source connected to the drain of P-channel transistor 78, a gate connected to node 65, and a drain for providing output voltage $V_{OUT}$. N-channel transistor 84 has a drain connected to the drain of P-channel transistor 82, a gate connected to node 65, and a source connected to the drain of N-channel transistor 86. Inverter 88 has an input terminal connected to the output terminal of monitor and control circuit 80, and an output terminal connected to the gate of N-channel transistor 64. Capacitor 90 has a first current electrode connected to the output terminal of monitor and control circuit 80, and a second current electrode connected to node 65. Capacitor 90 provides positive feedback in oscillator 60.

Figure 5:
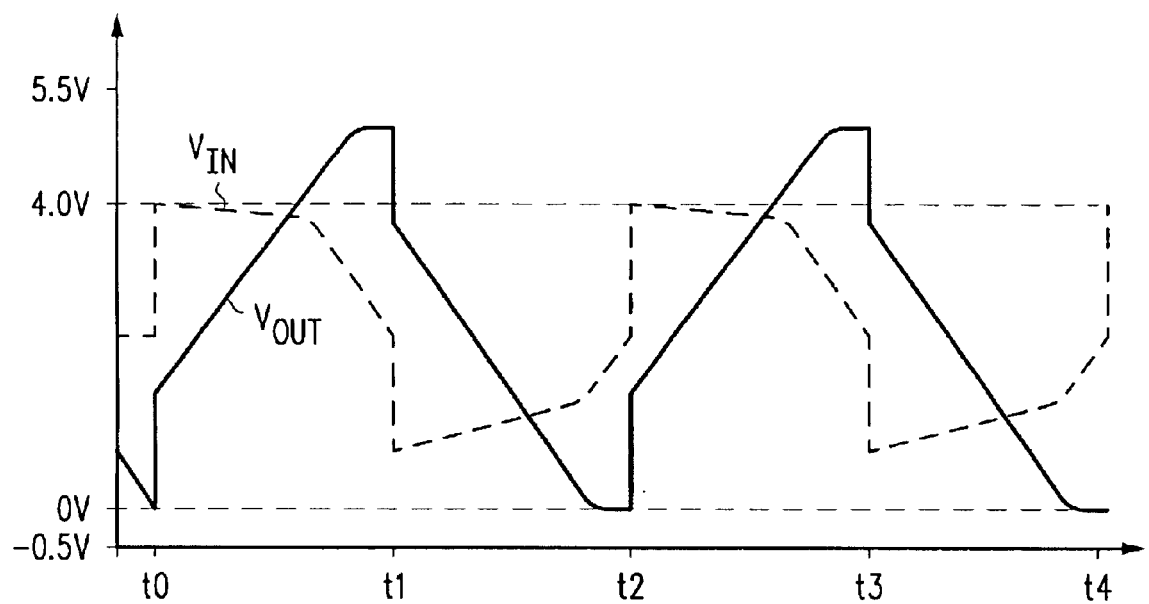
FIG. 5 illustrates a waveform of the input and output voltages of the oscillator circuit of FIG. 4.

FIG. 5 illustrates a waveform of the input and output voltages of oscillator circuit 60 of FIG. 4. Refer to both FIG. 4 and FIG. 5 in the following discussion of oscillator circuit 60. To understand how oscillator circuit 60 operates, assume that the comparator 68 input voltage is low (time t0 in FIG. 5), therefore the drive voltage of $V_{OUT}$ will be low and the feedback signal FB will switch the current sources 62 and 66 so that the current is flowing into capacitor 90 at the comparator 68 input node 65. This voltage will rise until it reaches the comparator threshold. As the voltage crosses the threshold, the comparator switches and the output voltage $V_{OUT}$ swings from its low level to its high level (between times t0 and t1). The high level voltage $V_{OUT}$ is coupled via the feedback capacitor 90 back to the comparator input node 65, causing the voltage there to rise by the amount of the output voltage swing (typically $V_{DD}$). Just after this occurs, the negative feedback signal FB also switches the direction of the current source to transistor 66, causing the discharge of capacitor 90 to begin at about time t1.

Eventually, at time t2, the node will discharge to the same comparator threshold, the output driver will switch low, the change will be fed back to input node 65 via capacitor 90. Negative feedback signal FB will again switch the current source 62 to charge the capacitor and the cycle will begin again at about time t2. The next half cycle between times t2 and t3 occurs in the same manner.

The duration of each half cycle is the time required for the current source to charge (or discharge) capacitor 90 by a voltage equal to the change in the output voltage $V_{OUT}$. Alternatively, it can be looked at as the time to inject (or remove) a charge from the input node equal to the charge coupled in via capacitor 90. This charge is Q=C*V. The time is t=Q/I=C*V/I for each half-cycle where C is the capacitance of capacitor 90.

Note that the value of the comparator 68 threshold voltage does not affect the frequency of oscillator 60. It is only important in regulating the voltage about which the input node swings, which is important as the current sources 62 and 66 may have limitations in the voltage that they can drive, and also may have parasitic diodes that clamp the voltage to no more than a diode drop outside the supply rails. In a typical application, the comparator threshold will be about $V_{DD}/2$ and therefore the voltage at input node 65 will swing by $V_{DD}$ above and below $V_{DD}/2$ to $1.5*V_{DD}$ and $-0.5*V_{DD}$. In order to preserve frequency stability, the current source circuits must not clamp this voltage swing.

In prior art oscillator circuit 10 of FIG. 1, an additional attenuation capacitor 16 is coupled at input node 15. Capacitor 16 attenuates the voltage swing at input node 15, typically by a factor of 2. Therefore, the voltage swing at node 15 is limited to be between 0 volts and $V_{DD}$, and is not clamped by parasitic diodes associated with current sources 12 and 14. Capacitor 16 has no effect on frequency because at the beginning and end of each half-cycle (i.e. when the input voltage is equal to the comparator threshold voltage), the charge on attenuation capacitor 16 is the same, and the current sources require the same time to inject the same charge as in the case where this capacitor is not used.

This invention, as illustrated in the embodiments of FIG. 3 and FIG. 4, limit the oscillator voltage in a different way. Instead of attenuating the signal at the input of the comparator, monitor & control circuit 50 of FIG. 3 and monitor and control circuit 80 of FIG. 4 control the voltage swing at the output of the comparator so that $V_{OUT}$ doesn't swing by enough to cause the input voltage to exceed the supply rails. The frequency stability is assured because all that matters is that at the time the voltage at the comparator input node is crossing the threshold, the output stage has fully swung to its final levels. To a large extent, what happens in the meantime is irrelevant.

By way of example, imagine that instead of voltage $V_{OUT}$ swinging from 0 volts to $V_{DD}$, it swings from 0 to $V_{DD}/2$ initially. The input voltage would swing from $V_{DD}/2$ to $V_{DD}$, which is still within the rails. The feedback capacitor would begin to discharge and when the voltage decreased to close to $V_{DD}/2$, $V_{OUT}$ completed its transition fully up to $V_{DD}$, the capacitor would continue to discharge and eventually the input node would reach the comparator threshold. At this point, the conditions are the same as if $V_{OUT}$ had swung completely initially, so the time required was the same and the frequency remains controlled.

Generally, according to the present invention, the monitor and control circuit monitors the input voltage (to see if it is too close to ground or too close to $V_{DD}$), to limit, or control, the swing of $V_{OUT}$ to be below or equal to the predetermined voltage until the input node voltage is moving from one rail toward the other rail.

Transistor 82 and Transistor 84 of monitor and control circuit 80 of FIG. 4 monitor the voltage at input node 65 and limit the application of $V_{OUT}$ from the drains of transistor 78 and transistor 86) to capacitor 90 so that the voltage at input node 65 does not get closer than a MOS (metal-oxide semiconductor) threshold voltage to the rails. Note that in the illustrated embodiment, the plurality of series-connected inverters 68 includes four inverters. However, in other embodiments, the number of series-connected inverters can be different than four. Also in the illustrated embodiment, the voltage at which the inverters switch logic states is about one-half of the power supply voltage. In other embodiments, the voltage at which the inverters switch logic states can be different. In addition, in other embodiments, the positions of transistors 82 and 84 can be exchanged with the positions for transistors 78 and 86, respectively.

Monitor and control circuit 80 maintains the periodic output signal of the comparator within the power supply rails without the use of an attenuation capacitor such as attenuation capacitor 16 in FIG. 1. The attenuation capacitor can be eliminated because its presence has no affect on the oscillation frequency. By eliminating the attenuation capacitor from the oscillator circuit, the oscillator circuit is smaller, thus saving surface area on the integrated circuit. Also, power supply current spikes are reduced because an attenuation capacitor is not being repeatedly charged and discharged along with the oscillation capacitor. In addition, if a user needs to be able to set the oscillation frequency using an externally connected capacitor, only one capacitor needs to be connected, thus reducing the number of externally connected components over the prior art oscillator circuit of FIG. 1.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An oscillator circuit, comprising:

a first current source having a first terminal coupled to a first power supply voltage terminal, and a second terminal for providing an input voltage;

a switch having a first terminal coupled to the second terminal of the first current source, a control terminal, and a second terminal;

a second current source having a first terminal coupled to the second terminal of the switch, and a second terminal coupled to a second power supply voltage terminal;

a comparator circuit having a input terminal coupled to the second terminal of the first current source for receiving the input voltage, the input voltage being compared to a predetermined threshold voltage to generate a periodic comparator output voltage at an output terminal of the comparator;

a monitor and control circuit having an input terminal coupled to the input terminal of the comparator, for monitoring and controlling a voltage swing of the periodic comparator output voltage to provide a controlled periodic output voltage at an output terminal of the monitor and control circuit; and a capacitor coupled between the input terminal of the comparator and the output terminal of the monitor and control circuit; and an inverter having a input terminal coupled to the output terminal of the monitor and control circuit, and an output terminal coupled to the control terminal of the switch.

2. The oscillator circuit of claim 1, wherein the first current source is a first transistor having a first current electrode coupled to the first power supply voltage terminal, a control electrode for receiving a first bias voltage, and a second current electrode coupled to the first terminal of the switch.

3. The oscillator circuit of claim 1, wherein the second current source is a second transistor having a first current electrode coupled to the second terminal of the switch, a control electrode for receiving a second bias voltage, and a second current electrode coupled to the second power supply voltage terminal.

4. The oscillator circuit of claim 1, wherein the comparator circuit comprises a plurality of series-connected inverters, the plurality of series-connected inverters comprising:

a first inverter having an input terminal coupled to receive the input voltage, the predetermined threshold voltage being a voltage at which the input voltage crosses to cause an output voltage of the first inverter to change from a logic high voltage to a logic low voltage; and a last inverter comprising a first pair of series-connected transistors, control electrodes o the pair of series-connect transistors coupled to receive a voltage corresponding to the output voltage of the first inverter.

5. The oscillator circuit of claim 4, wherein the monitor and control circuit comprises a second pair of series-connected transistors coupled between the first pair of series-connected transistors, control electrodes of the second pair of series-connected transistors coupled to the input terminal of the first inverter, and connected-together current electrodes of the second pair of series-connected transistors coupled to the capacitor.

6. The oscillator circuit of claim 1, wherein the oscillator circuit is implemented as on an integrated circuit.

7. An oscillator circuit, comprising:

a plurality of series-connected inverters, a first inverter of the plurality of series-connected inverters having an input terminal for receiving a periodic input voltage, a last inverter of the plurality of series-connected inverters having an output terminal for providing a periodic output voltage;

a first current source having a first terminal coupled to a first power supply voltage terminal, and a second terminal coupled to the input terminal of the first inverter a switch having a first terminal coupled to the second terminal of the first current source, a control terminal for receiving a control signal, and a second terminal;

a second current source having a first terminal coupled to the second terminal of the switch, and a second terminal coupled to a second power supply voltage terminal;

a monitor and control circuit having an input terminal coupled to the plurality of series-connected inverters, for monitoring and controlling a voltage swing of the periodic output voltage and to provide a controlled periodic output at an output terminal of the monitor and control circuit; and a capacitor coupled between the output terminal of the monitor and control circuit and the input terminal of the first inverter.

8. The oscillator circuit of claim 7, further comprising:

a second inverter having an input terminal coupled to the output terminal of the first inverter, and an output terminal;

a third inverter having an input terminal coupled to the output terminal of the second inverter, and an output terminal coupled to an input terminal of the last inverter; and a fourth inverter having an input terminal coupled to the output terminal of the third inverter, and an output terminal coupled to the control terminal of the switch.

9. The oscillator circuit of claim 8, wherein the last inverter comprises a first pair of series-connected transistors coupled between the first and second power supply voltage terminals and wherein the monitor and control circuit comprises a second pair of series-connected transistors coupled between the first pair of series-connected transistors, control electrodes of the second pair of series-connected transistors coupled to the input terminal of the first inverter, and a current electrode of each of the second pair of series-connected transistors are coupled to the capacitor.

10. The oscillator circuit of claim 7, wherein the plurality of series-connected inverters comprises an even number of series-connected inverters.

11. The oscillator circuit of claim 7, wherein the oscillator circuit is implemented on an integrated circuit.

12. The oscillator circuit of claim 11, wherein an oscillation frequency of the oscillator circuit is a function of a capacitance of the capacitor.

13. The oscillator circuit of claim 12, wherein the capacitor is implemented external to the integrated circuit.

14. An oscillator circuit, comprising:

a comparator circuit having a input terminal for receiving a periodic input voltage, and an output terminal for providing a periodic output voltage in response to the periodic input voltage crossing a predetermined threshold voltage, the comparator comprising a plurality of series-connected inverters, a first inverter of the plurality of series-connected inverters having an input terminal for receiving the periodic input voltage, a last inverter of the plurality of series-connected inverters having an output terminal for providing the periodic output voltage;

a monitor and control circuit having an input terminal coupled to the input terminal of the comparator, for monitoring and controlling a voltage swing of the periodic output voltage to provide a controlled periodic output voltage at an output terminal of the monitor and control circuit; and a capacitor coupled between the output terminal of the monitor and control circuit and input terminal of the comparator.

15. The oscillator circuit of claim 14, wherein the plurality of series-connected inverters further comprises:

a second inverter having an input terminal coupled to an output terminal of the first inverter, and an output terminal; and a third inverter having an input terminal coupled to the output terminal of the second inverter, and an output terminal coupled to an input terminal of the last inverter.

16. The oscillator circuit of claim 15, further comprising:

a first current source having a first terminal coupled to a first power supply voltage terminal, and a second terminal coupled to the input terminal of the first inverter for providing the periodic input voltage;

a switch having a first terminal coupled to the second terminal of the first current source, a control terminal for receiving a control signal, and a second terminal; and a second current source having a first terminal coupled to the second terminal of the switch, and a second terminal coupled to a second power supply voltage terminal.

17. The oscillator circuit of claim 15, further comprising a fourth inverter having an input terminal coupled to the output terminal of the third inverter, and an output terminal coupled to provide the control signal to the switch.

* * * * *